United States Patent
Nickel et al.

(10) Patent No.: US 9,213,053 B2
(45) Date of Patent: Dec. 15, 2015

(54) SYSTEM FOR FIELD TESTING WIRELESS DEVICES WITH REDUCED MULTIPATH INTERFERENCE

(75) Inventors: Joshua G. Nickel, San Jose, CA (US); Robert W. Mayor, Half Moon Bay, CA (US); Glenn D. MacGougan, Cupertino, CA (US); William J. Noellert, Mountain View, CA (US); Joseph Hakim, Boulder Creek, CA (US)

(73) Assignee: Apple Inc., Cupertino, CA (US)

( * ) Notice: Subject to any disclaimer, the term of this patent is extended or adjusted under 35 U.S.C. 154(b) by 1413 days.

(21) Appl. No.: 12/959,350

(22) Filed: Dec. 2, 2010

(65) Prior Publication Data

US 2012/0139571 A1    Jun. 7, 2012

(51) Int. Cl.
*G01R 31/00*    (2006.01)
*G01R 29/08*    (2006.01)
*H04W 24/08*    (2009.01)

(52) U.S. Cl.
CPC .......... *G01R 29/0821* (2013.01); *H04W 24/08* (2013.01)

(58) Field of Classification Search
CPC .. G01R 1/18; G01R 1/07342; G01R 1/06711; G01R 1/06772; G01R 31/20; G01R 31/28; G01R 31/2822; G01R 31/002; G01R 31/2886; G01R 31/2889; G01R 29/08; G01R 29/0821; G01R 29/105; H04W 24/00; H04W 24/08; H04B 17/0042; H04B 17/002; H04B 17/0057; H04B 17/008
USPC ........ 324/750.26, 750.27, 754.31; 455/67.11, 455/67.12, 261; 375/224, 213
See application file for complete search history.

(56) References Cited

U.S. PATENT DOCUMENTS

| | | | |
|---|---|---|---|
| 5,805,667 A | 9/1998 | Alvarez et al. | |
| 6,323,419 B1 | 11/2001 | Toy | |
| 8,295,777 B1 * | 10/2012 | Yenney et al. | 455/67.12 |
| 2002/0160717 A1 | 10/2002 | Persson et al. | |
| 2003/0003883 A1 * | 1/2003 | Wallace et al. | 455/115 |
| 2006/0017630 A1 * | 1/2006 | Kildal | G01R 29/105 |
| | | | 343/703 |
| 2006/0132355 A1 * | 6/2006 | Krenz et al. | 342/165 |
| 2006/0232491 A1 * | 10/2006 | Nakamura | G01R 29/0821 |
| | | | 343/821 |
| 2007/0021053 A1 * | 1/2007 | Marrah | 455/3.02 |
| 2007/0159199 A1 | 7/2007 | Talwar et al. | |
| 2008/0056340 A1 | 3/2008 | Foegelle | |

(Continued)

OTHER PUBLICATIONS

Kunysz, Waldemar. "A Three Dimensional Choke Ring Ground Plane Antenna." [online]. NovAtel Inc. [retrieved on Dec. 2, 2010]: <URL: http://webone.novatel.ca/assets/Documents/Papers/3D_choke_ring.pdf>.

*Primary Examiner* — Tung X Nguyen
*Assistant Examiner* — Thang Le
(74) *Attorney, Agent, or Firm* — Treyz Law Group, P.C.; Joseph F. Guihan

(57) ABSTRACT

A portable test chamber with an open top may serve as a field testing apparatus for wireless testing of electronic devices. A wireless device under test may be mounted within a cavity in the test chamber. The cavity may be surrounded by a dielectric lining of anechoic material. A layer of electromagnetic shielding such as metal foil may cover the outer surfaces of the dielectric lining. The chamber may have a box shape with a rectangular opening at its top. Satellite navigation system signals or other wireless signals may be received through the opening at the top of the test chamber during testing. The electromagnetic shielding may reduce the effects of multipath interference during field tests.

14 Claims, 9 Drawing Sheets

(56) References Cited

U.S. PATENT DOCUMENTS

| | | | |
|---|---|---|---|
| 2009/0008146 A1* | 1/2009 | Oleske | 174/350 |
| 2009/0051366 A1* | 2/2009 | Miyauchi | G01R 31/2822 324/537 |
| 2009/0097087 A1* | 4/2009 | Wolter et al. | 359/196.1 |
| 2009/0295648 A1* | 12/2009 | Dorsey et al. | 343/702 |
| 2010/0233969 A1 | 9/2010 | Frolik et al. | |
| 2010/0283684 A1* | 11/2010 | Rabinovich et al. | 343/700 MS |
| 2011/0200084 A1* | 8/2011 | Griesing | H04W 24/00 375/224 |
| 2012/0178364 A1* | 7/2012 | Dobyns | 455/41.1 |

* cited by examiner

SYSTEM FOR FIELD TESTING WIRELESS DEVICES WITH REDUCED MULTIPATH INTERFERENCE

BACKGROUND

This relates to testing electronic devices, and, more particularly, to field testing wireless electronic devices in environments that are prone to multipath interference.

Electronic devices such as cellular telephones include wireless circuitry. It is often desirable to test wireless electronic devices in the field so that the performance of the devices can be evaluated under real world conditions. It may, for example, be desirable to evaluate how well a device receives Global Positioning System (GPS) signals from GPS satellites through the earth's atmosphere. Tests of this type may be difficult or impossible to perform in a laboratory.

Multipath interference can arise when radio-frequency signals reflect off of objects such as buildings and the ground before reaching a device under test. When performing testing such as GPS testing, multipath interference can make accurate measurements difficult to obtain. The impact of multipath interference can sometimes be minimized by taking numerous measurements over an extended period of time and averaging these measurements. While making measurements over extended periods of time can be helpful in reducing multipath noise, this approach is not always convenient or practical and reduces test throughput.

It would therefore be desirable to be able to provide improved ways in which to avoid the effects of multipath interference when testing wireless electronic devices.

SUMMARY

A wireless device under test such as a cellular telephone or computer may contain a radio-frequency receiver. The radio-frequency receiver may be associated with a satellite navigation system such as the Global Positioning System or may be used in receiving other radio-frequency signals such as radio-frequency signals from cellular telephone networks or other wireless sources.

During field testing, the presence of multipath interference may make it difficult to gather accurate test measurements. Multipath interference can be reduced to acceptable levels by placing one or more wireless devices under test within a chamber in a portable test apparatus. The chamber may have a box-shaped cavity that is surrounded by a dielectric lining material such as anechoic tiling material. A layer of electromagnetic shielding such as metal foil may cover the outer surfaces of the dielectric lining.

The chamber may have a rectangular opening at its top, or may have an opening of another suitable shape on the top or other side of the chamber. Satellite navigation system signals or other wireless signals may be received through the opening in the chamber. The electromagnetic shielding may cover other surfaces of the chamber to reduce the effects of multipath interference during field tests.

Further features of the invention, its nature and various advantages will be more apparent from the accompanying drawings and the following detailed description of the preferred embodiments.

DETAILED DESCRIPTION

Figure 1:
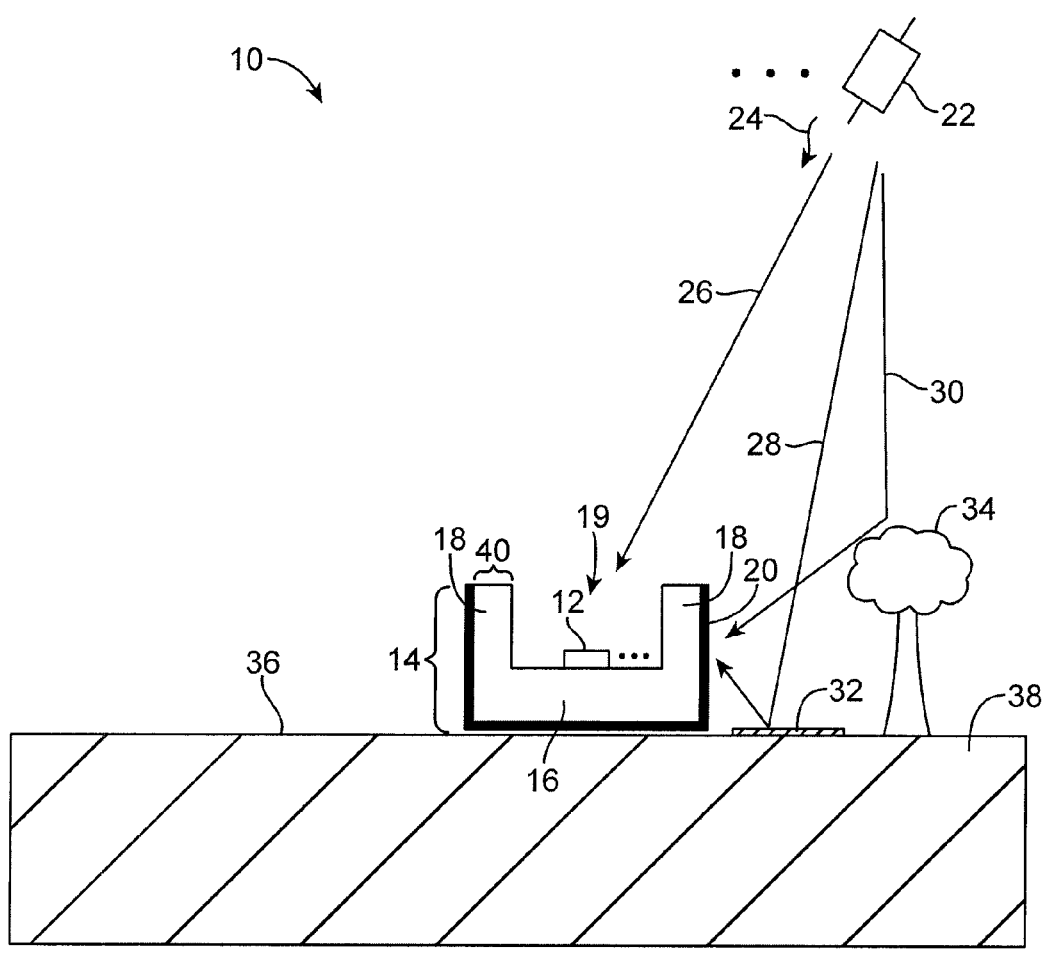
FIG. 1 is a diagram showing how a field test system may be used in testing a wireless device in the field in accordance with an embodiment of the present invention.

An illustrative environment in which one or more wireless electronic devices may be tested is shown in FIG. 1. As shown in FIG. 1, system 10 may include one or more sources of wireless signals such as satellites 22. In general, the wireless sources in system 10 may include cellular telephone towers, satellites, and other sources of radio-frequency signals. In the example of FIG. 1, which is sometimes described herein as an example, wireless signals 24 are generated by one or more satellites 22. This is, however, merely illustrative. Wireless testing in system 10 may, in general, be performed using any suitable sources of radio-frequency signals.

Satellites 22 may be associated with a satellite navigation system such as the Global Positioning System. Global Positioning System (GPS) satellites 22 may emit radio-frequency GPS signals 24 at 1575 MHz.

One or more wireless devices to be tested (sometimes referred to as the device or devices under test) such as device under test 12 may be placed within an open-topped (or opensided) enclosure such as field test system 14. Field test system 14 may have a chamber with a box shape or other suitable shape with an opening such as opening 19. Opening 19 may be formed in the upper side of the field test system or may be formed on a left or right side of the field test system, or any other suitable side of the field test system. Opening 19 allows radio-frequency signals 24 to reach radio-frequency receiver circuitry such as satellite navigation system receiver circuitry (e.g., GPS receiver circuitry) or other receiver circuitry within device under test 12.

Field test system 14 may be placed on the ground (i.e., surface 36 of earth 38 in an outdoors location) or may be mounted on a platform. The platform may be fixed or movable.

Radio-frequency signals 24 may take a variety of different paths through the earth's atmosphere above earth 28. Some signals may pass directly through opening 19 in field test system 14 to device under test 12, as illustrated by direct path 26. Other signals will reflect off of surrounding objects in system 10 such as object 34 (e.g., a tree or building), as illustrated by path 30. Path 28 illustrates how some of signals 24 may reflect off of moisture 32 (e.g., damp earth or a pool of standing water) on surface 36 of ground 38. Other manmade and natural objects may also serve as reflective surfaces for radio-frequency signals 24 when test measurements are made outdoors as shown in FIG. 1.

Radio-frequency signals that follow direct paths to device under test 12 without reflecting off of any objects and that exhibit sufficient signal strength can be satisfactorily processed by the radio-frequency receiver circuitry of device under test 12. In the context of satellite navigation systems such as the Global positioning System, signals such as signals 24 that follow direct paths from satellites 22 to device under test 12 such as path 26 can be received and processed to produce information such as geographic position and movement information (sometimes referred to location data).

Signals that reach device under test 12 only after striking one or more objects follow paths with multiple individual segments and tend to be distorted. These signals (i.e., signals that flow along paths such as paths 30 and 28 of FIG. 1) are generally referred to as multipath interference signals and degrade receiver performance.

In an idealized world, multipath interference would be constant and would tend to influence performance parameters such as the signal-to-noise ratio of received signals at device under test 12 in a fixed fashion during tests. In practice, however, the strength of multipath interference signals can vary significantly as the position and orientation of reflecting objects in system 10 change over time. The strength of multipath interference signals may, for example, increase and decrease dramatically as items such as tree branches, ground moisture on earth, nearby vehicles, and other elements of system 10 change their position relative to device under test 12.

During testing of device under test 12 (or multiple devices under test 12) to evaluate the performance of receiver circuitry in device under test 12, device under test 12 may take test measurements. Device under test 12 may run a test program that captures test data internally within the memory of device under test 12 for subsequent processing by external test equipment. Device under test 12 may transfer test measurements to external test equipment in real time or after test completion using a wired or wireless path. Following analysis of the wireless test measurements using the external test equipment, appropriate actions can be taken. For example, if the GPS receiver or other wireless receiver of device under test 12 is not performing satisfactorily, software and/or hardware design changes can be made to rectify the shortcomings of the GPS receiver. If the GPS receiver is performing satisfactorily, the design for the device under test may be used in manufacturing production devices.

To minimize the variation of test measurements as a function of time that arise from multipath interference signals, field test system 14 may be provided with electromagnetic shielding structures such as conductive walls 20. Anechoic tiling material (radio-frequency signal absorbent material) or other lossy dielectric material 40 may form sidewall lining structures 18 and base (bottom wall) lining structures 16. Lining structures 18 and 16 may help reduce undesired internal reflections within field test system 10 that could adversely affect test measurements.

Walls 20 may be formed from metal sheets or other conductive material. As an example, walls 20 may be formed from metal foil. Other types of conductive structures may be used to form some or all of the electromagnetic shielding in field test system 14 if desired (e.g., planar metal structures such as metal plates, metal structures that are non-planar, metal structures that form part of a vehicle such as body panels or other exterior metal structures, metal plates that are part of other equipment, other conductive sheets of material, etc.). Shielding structures such as walls 20 may block signals 24 that are flowing along multipath interference signal paths such as paths 28 and 30, as shown in FIG. 1. Because multipath interference is reduced, the signals that reach device under test 12 will tend not to vary significantly as a function of time.

Figure 2:
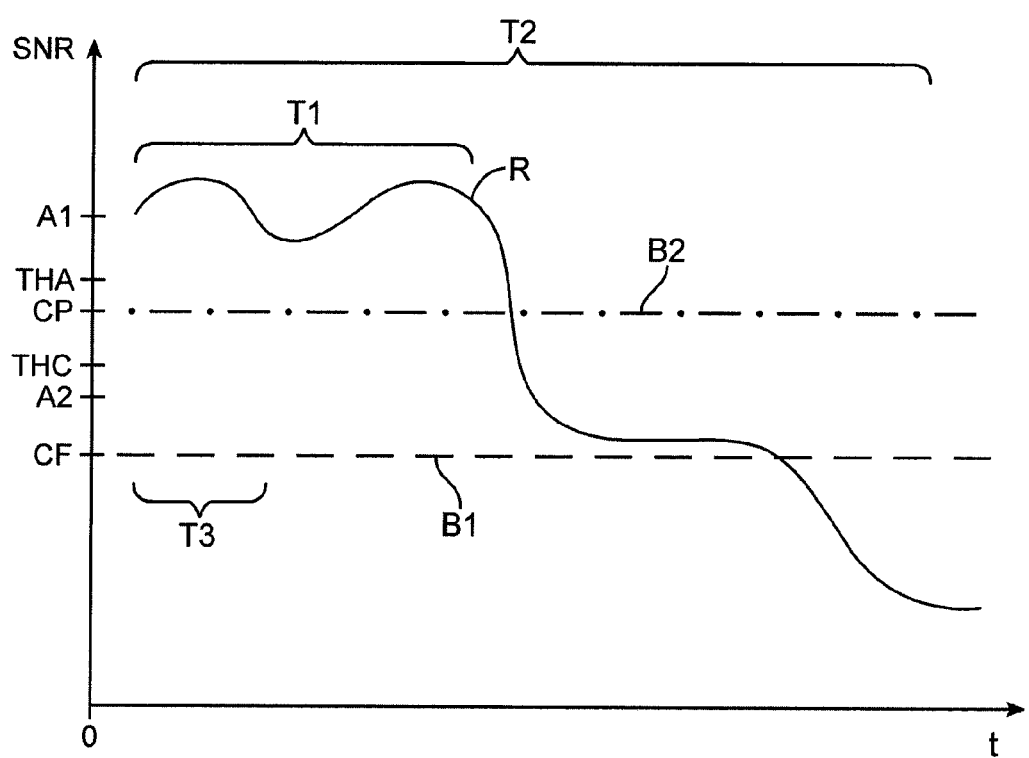
FIG. 2 is a graph showing how test signals may vary as a function of time when using and when not using a field test system of the type shown in FIG. 1 in accordance with an embodiment of the present invention.

The graph of FIG. 2 shows how reductions in the time dependence of test signals can be used to improve testing of device under test 12. As shown in graph of FIG. 2, test measurements such as signal-to-noise ratio (SNR) measurements and other radio-frequency receiver performance measurements can be plotted as a function of time t. To determine whether device under test 12 is performing satisfactorily, the measured value of SNR for a device under test 12 can be compared to a predetermined threshold value (as an example).

The type of signal-to-noise ratio measurement that may be made in a system such as system 10 of FIG. 1 in the absence of field test system 14 is represented by solid line R. To determine whether device under test 12 is performing satisfactorily, the value of signal-to-noise ratio signal R can be compared to threshold value THA. If the value of R is greater than THA, the device may be considered to be performing satisfactorily (i.e., the device will have passed testing). If the value of R is less than threshold THA, the device may be considered to be performing unsatisfactorily (i.e., the device will have failed testing).

Meaningful comparisons between the value of measured signal-to-noise ratio R and threshold THA can only be made if the measured data is averaged over a sufficiently long period of time. The comparison of measurements that have been averaged over an insufficiently long period of time to threshold THA can lead to erroneous results. For example, if the value of curve R is averaged over the time period T1, the resulting average value of R will be A1. If this value were to be compared to threshold THA to evaluate device performance, it would be concluded (erroneously) that the device is operating satisfactorily (i.e., because A1 exceeds THA). If a sufficiently long period of time is used to measure the value of R, the results will be different. In particular, if the value of R is measured and averaged over a longer time period such as time period T2, the resulting average value of R would be A2.

Comparing the value of A2 to THA would accurately reveal that the device is performing poorly (i.e., because A2 is less than THA).

As this example demonstrates, in the absence of field test system 14, the time-dependent changes in test measurements that result from time-varying multipath interference signals can force test personnel to gather test data over relatively long periods of time such as time period T2. In a typical outdoors test environment, a sufficiently large value for T2 to yield consistent test results may be 12 hours or more. Long test periods such as this can be burdensome and reduce test throughput.

By using field test system 14, the impact of multipath interference signals can be reduced and test times can be minimized. Dashed line B1 and dotted-and-dashed line B2 of FIG. 2 correspond to illustrative test measurements made using field test system 14. As shown by the relatively time invariant shape of curves B1 and B2, the use of field test system 14 makes test results less dependent on time-varying system changes such as changes in the positions and orientations of reflective objects in the vicinity of device under test 12. This is because electromagnetic (radio-frequency) shielding layer 20 and lossy dielectric lining material 40 help prevent multipath interference signals from reaching device under test 12.

The average value of the signal-to-noise ratio measurements of curve B1 is CF, whereas the average value of the signal-to-noise ratio measurements of curve B2 is CP. Because the signals of curves B1 and B2 are relatively time invariant, accurate values of CF and CP can be measured by averaging portions of curves B1 and B2 over time intervals such as time period T3. Time period T3 may be, for example, less than time periods T2 and T1 (e.g., less than 12 hours, less than 6 hours, less than 3 hours, less than one hour, less than 30 minutes, etc.). Because accurate test measurements can be obtained in a reduced amount of time using field test system 14, test time can be minimized, while retaining accuracy. In the FIG. 2 example, curve B1 and its time-averaged value of CF is less than predetermined threshold value THC and therefore corresponds to unsatisfactory device performance. Curve B2 and its time-averaged value of CP is greater than predetermined threshold value THC and therefore corresponds to satisfactory device performance.

Figure 3:
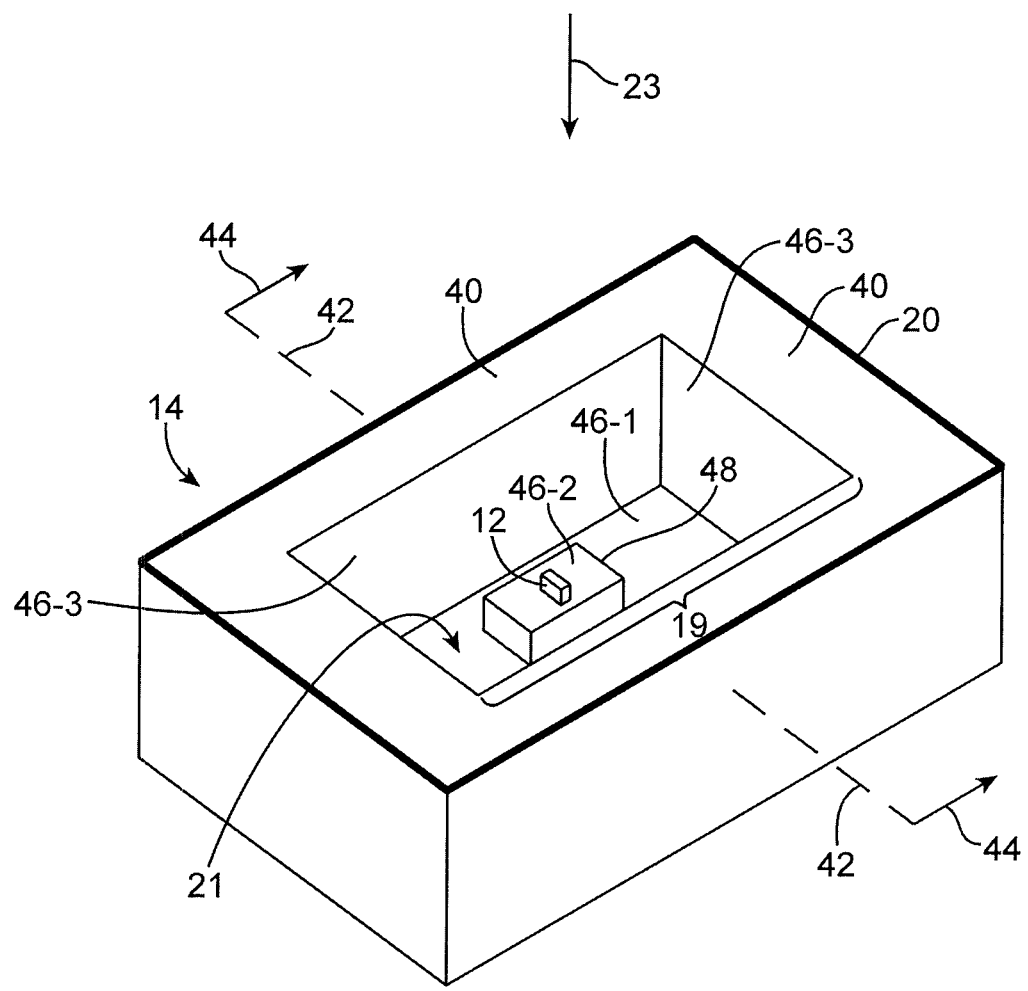
FIG. 3 is a perspective view of a field test system of the type shown in FIG. 1 in accordance with an embodiment of the present invention.

FIG. 3 is a perspective view of field test system 14 and an associated device under test (device 12). As shown in FIG. 3, device under test 12 may be mounted within an air-filled cavity such as cavity 21 under opening 19. Cavity 21 may be, for example, a box-shaped (rectangular) cavity, a cavity having curved surfaces, a cavity having both curved and planar surfaces, or any other suitable cavity. In the example of FIG. 3, cavity 21 has a lower surface 46-1 and four interior sidewall surfaces 46-3 arranged at right angles to each other (e.g., to form a rectangular shape for opening 19 when viewed from vertical direction 23).

As shown in FIG. 3, a support structure such as support structure 48 may be used to support device under test 12 within chamber 21. Support structure 48 may be formed from a lossy dielectric of the type used in forming sidewall lining material 18 and base lining material 16 (i.e., structure 48 may be considered to form part of lossy dielectric lining 40). Examples of lossy dielectrics that may be used for material 40 include anechoic chamber lining materials (RF signal absorbing materials) such as anechoic chamber tiles formed from one or more layers of polymer. The polymer (or other material) that makes up lining 40 may include air bubbles or other voids of a variety of different sizes.

Figure 4:
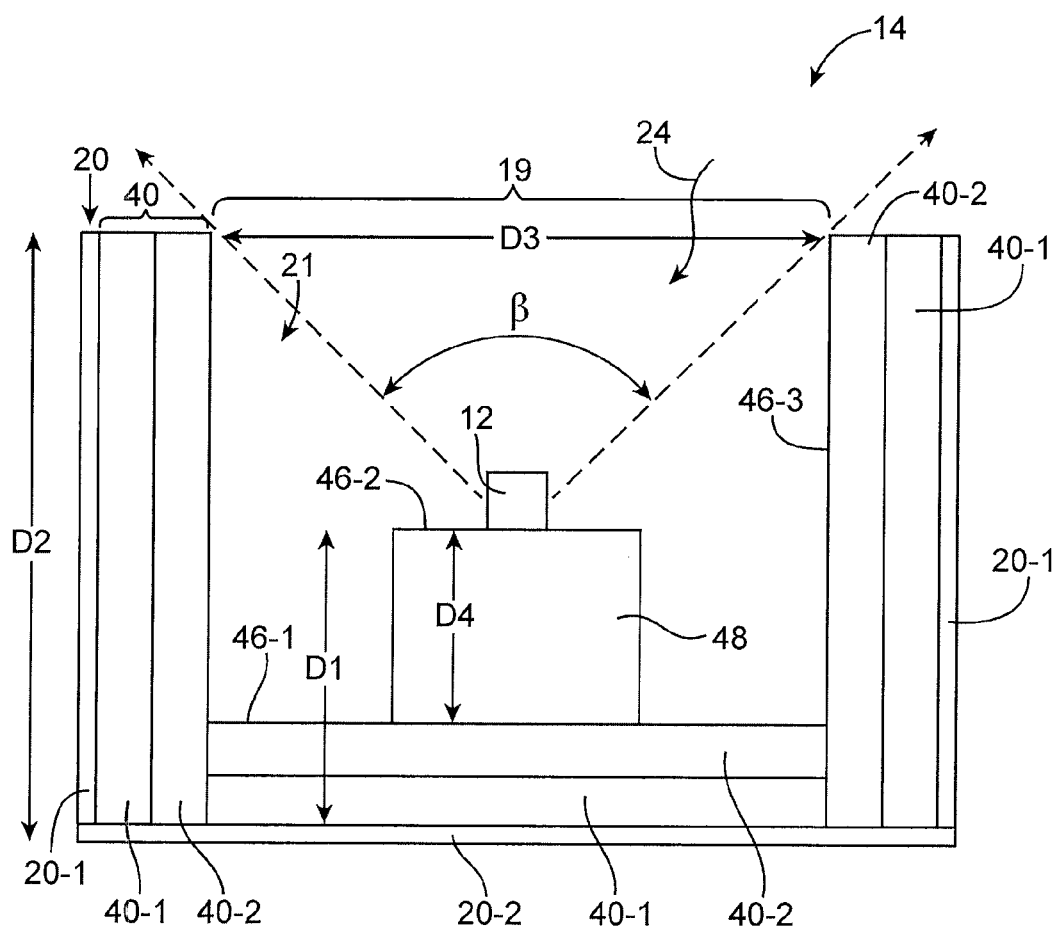
FIG. 4 is a cross-sectional side view of the field test system of FIG. 3 in accordance with an embodiment of the present invention.

A cross-sectional side view of field test system 14 taken along line 42-42 of FIG. 3 and viewed in direction 44 is shown in FIG. 4. As shown in FIG. 4, field test system 14 may have an opening 19 through which radio-frequency signals 24 can pass to reach device under test 12.

Dielectric lining material 40 may be formed from multiple sheets of material such as outer sheets 40-1 and inner sheets 40-2. The thickness of material 40 may be chosen to be sufficient to attenuate spurious radio-frequency signals within chamber 21. For example, the thickness of material 40 may be 15 cm or less, 10 cm or less, 5 cm or less, 5-15 cm, 1-30 cm, 1-50 cm, 2-20 cm, at least 2 cm, at least 5 cm, more than 15 cm, etc.

Conductive radio-frequency shielding layer 20 may be formed from sheets of metal foil (e.g., aluminum foil) or other suitable planar structures such as sheets 20-1 (on the sidewalls of system 14) and sheet 20-2 (on the lower planar surface of system 14). The thickness of sheets 20-1 and 20-2 may be, for example, less than 1 cm, less than 1 mm, or less than 0.1 mm (as examples). Adhesive layers or other suitable fastening arrangements may be used to attach the structures of field test system 14 to each other.

Field test system 14 may have dimensions that are suitable for accommodating device under test 12. Lateral system dimensions such as dimension D3 may, for example, be chosen to be sufficiently large to accommodate the size of expected devices under test (e.g., tablet computers, handheld devices, etc.). The vertical dimension (height) D4 of support 48 may be adjusted so that the height D1 of device under test 12 above rear surface 20-2 of system 12 has a desired value. At larger values of D4 and D1, angle of acceptance $\beta$ will be increased, so that satellite signals 24 from more of the sky above device under test 12 can be received. At smaller values of D4 and D1, angle of acceptance $\beta$ will be decreased, so that satellite signals will only be received at device 12 from a smaller portion of the sky above device 12. Additions to the height (D2) of field test system 14 will also tend to decrease $\beta$. In a typical configuration, D2 may be about 73 cm, D1 may be about 30 cm, and D3 may be about 42 cm (in a first horizontal dimension) and about 55 cm (in a second horizontal dimension that is perpendicular to the first horizontal dimension), so that angle of acceptance $\beta$ is about 23° (e.g., so that $\beta$ is about 18-28°). These are merely illustrative examples. The values of D1, D2, D3, and D4 may have any suitable magnitudes (e.g., values of 1 cm to 200 cm, more than 200 cm, or less than 1 cm, etc.) and $\beta$ may have any suitable resulting magnitude.

Figure 5:
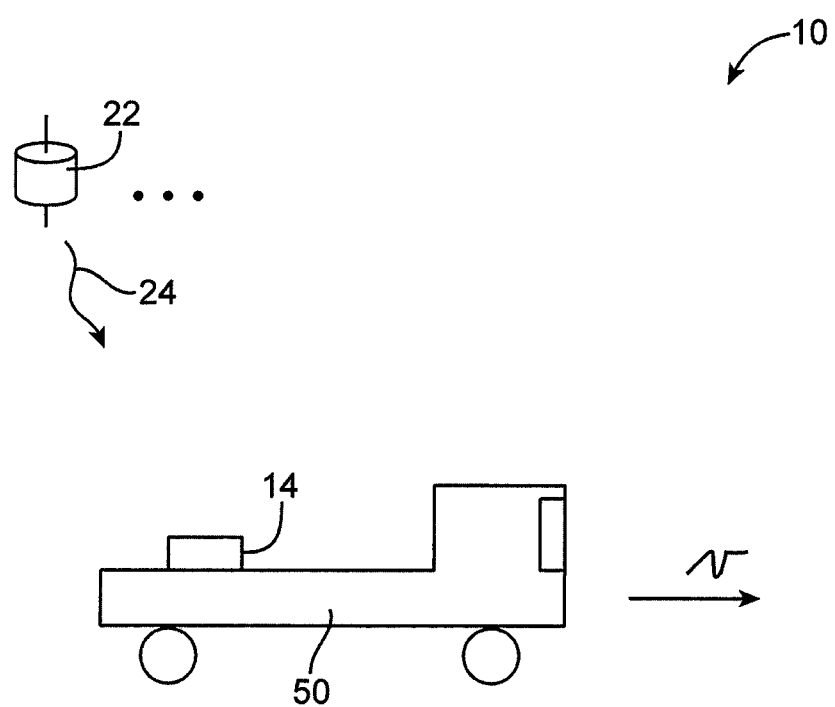
FIG. 5 is a diagram showing how a field test system of the type shown in FIG. 1 may be used in making test measurements when attached to a moving vehicle in accordance with an embodiment of the present invention.

FIG. 5 is a diagram showing how a portable test apparatus such as field test system 14 may be mounted on a vehicle such as vehicle 50. Vehicle 50 may be a truck or other vehicle with an open exterior area on which to rest field test system 14 or may be a customized vehicle (e.g., a vehicle with an opening in its roof or trunk that is sized appropriately to accommodate field test system 14). Vehicle 50 may be used to move field test system 14 during test measurements (e.g., at various velocities v). This allows device under test 12 to be tested in a mobile environment (e.g., to test how well a GPS receiver in device under test 12 can acquire location information during movement of device under test 12).

Figure 6:
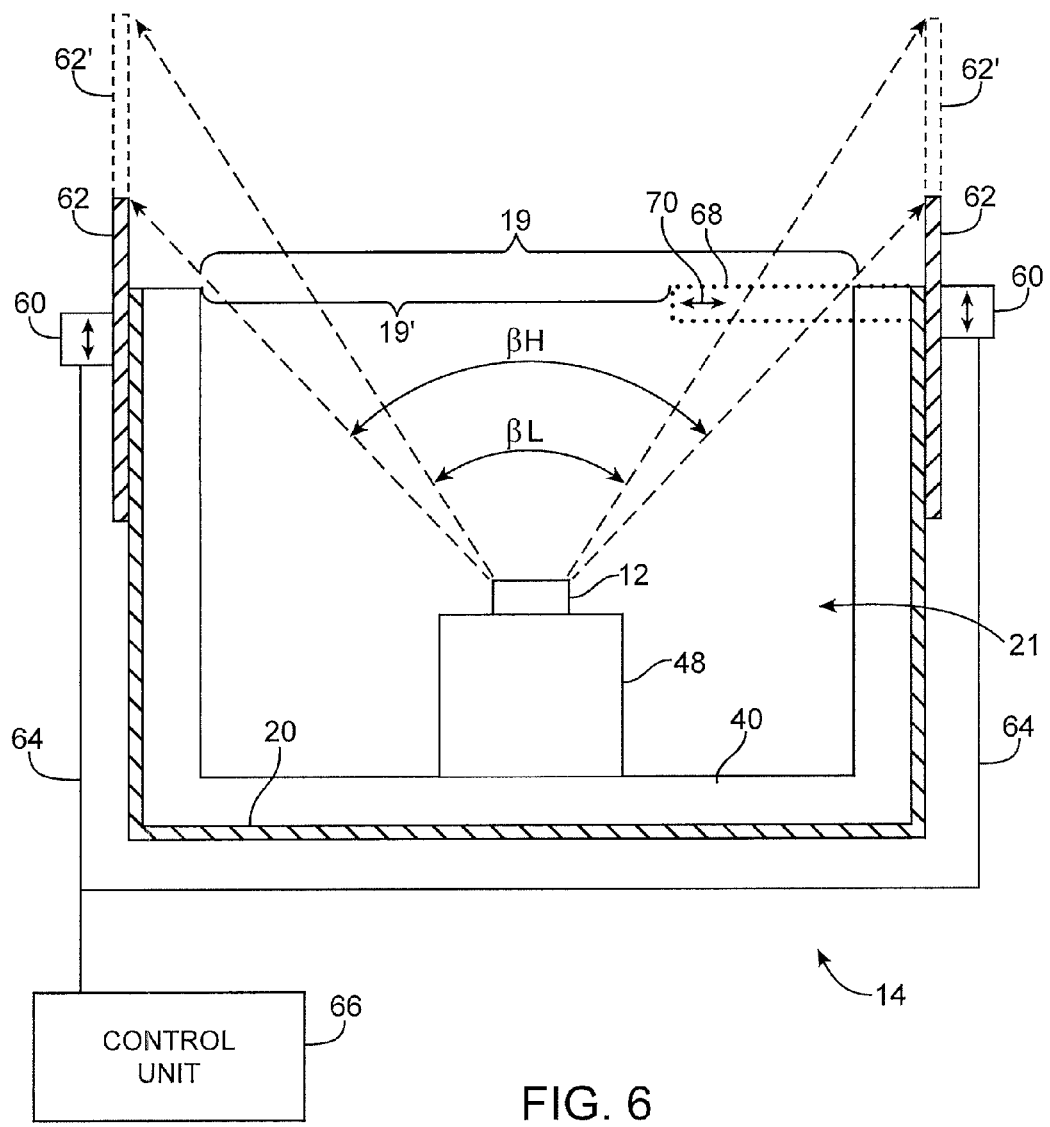
FIG. 6 is a diagram of an illustrative field test system having a chamber with an adjustable opening in accordance with an embodiment of the present invention.

As shown in FIG. 6, field test system 14 may be adjustable. Control unit 66 may be associated with a computer, a processor in a tester, or other suitable testing equipment and may be coupled to device under test 12 using a wired path or wireless path to obtain test data from device under test 12 in real time or following acquisition of a set of test data by device under test 12. During operation, control unit 66 may run control software. The control software may have default settings and user-adjustable settings that establish parameters for the field test system such as the size of opening 19, the height of sidewall portions of shielding 20, the position of one or more devices under test 12 within the chamber, or any other suitable adjustable test system parameters.

As shown in FIG. 6, control unit 66 may control actuators 60 (e.g., stepper motors, solenoids, linear and/or rotational positioning equipment, or other actuators) by providing actuators 60 with control signals over control paths 64. Actuators 60 may, in response, adjust the position of one or more structures within field test system. For example, actuators 60 may raise or lower adjustable electromagnetic shielding sleeve 62. Sleeve 62 may be formed from metal sheets, from metal foil such as aluminum foil that has been mounted on a dielectric substrate, etc. By adjusting the vertical position of adjustable shielding such as shielding portion 62 or otherwise controlling the position of structure 62, the angle of acceptance of radio-frequency signals within field test system 14 and other test system parameters can be adjusted under the control of control unit 66. If, for example, control unit 66 issues instructions that direct actuators 60 to lower shielding portion 62 to the position shown in FIG. 6, the angle of acceptance for incoming radio-frequency signals at device under test 12 can be set to angle βL. If, however, control unit 66 issues instructions that direct actuators 60 to raise the adjustable shielding to the position shown by dashed lines 62', the angle of acceptance can be narrowed to angle βH.

Other parameters associated with field test system 14 may likewise be adjusted if desired. For example, adjustable shielding material may be used to adjust the size of opening 19. In a first configuration, no shielding structures may protrude into opening 19 of FIG. 6, so that opening 19 has a maximum size. In a second configuration, shielding structures 68 may cover some of the opening to restrict the size of the opening to the size represented by opening 19' in FIG. 6. An actuator may be used to control the location of shielding structures 68, as indicated by line 70 in FIG. 6. Actuators may also be used to raise and lower support 48, to rotate support 48, or to otherwise adjust the position of device under test 12 within cavity 21.

As these examples demonstrate, the size, shape, and location of structures in field test system 14 such as the position of dielectric and conductive materials within system 14 and the location of device under test 12 within cavity 21 may be dynamically adjusted during testing under the control of control unit 66 or other test equipment. Control unit 66 or other suitable test equipment may be used to receive resulting test measurements from device under test 12 for analysis. Dynamic adjustments may be used to adjust the size of opening 19, the angle of acceptance 13, the position of device under test 12 within cavity 21, the position of a sleeve or other movable electromagnetic shielding structures, the position of anechoic material 20, or the position of other structures associated with field test system 14.

Figure 7:
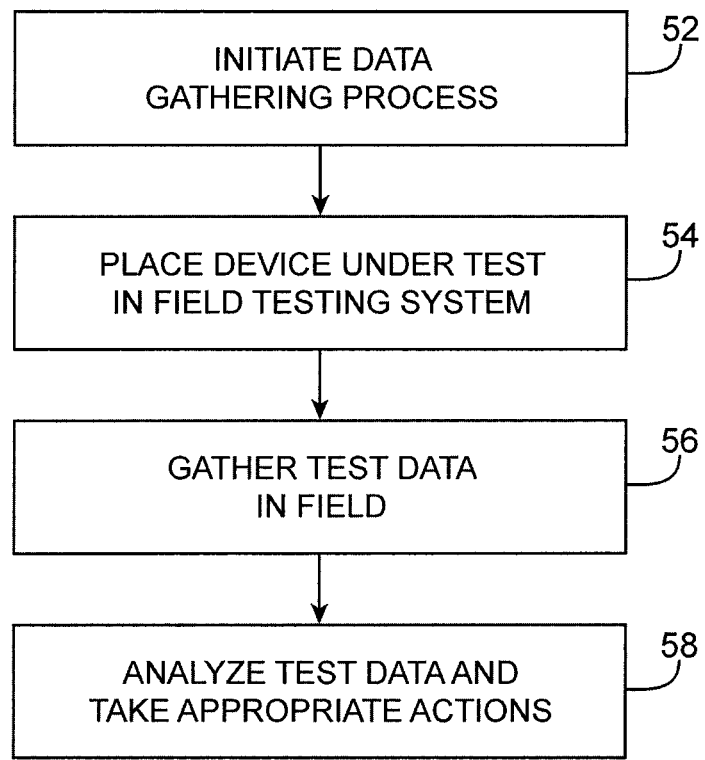
FIG. 7 is a flow chart of illustrative steps involved in operating a field test system of the type shown in FIG. 1 in accordance with an embodiment of the present invention.

Illustrative steps involved in using a portable test chamber with an open top such as field test system 14 in testing the wireless performance of device under test 12 are shown in FIG. 7.

At step 52, a test data gathering program (e.g., code that is part of an operating system or a separate application) may be launched on one or more devices such as device 12. Test personnel may, for example, select on-screen options that initiate the test program. The test program may run routines that gather test signal measurements using the wireless circuitry of device 12 (e.g., signal-to-noise measurements, raw data measurements, other processed test signal measurements, measurements from a satellite navigation system receiver such as a GPS receiver, measurements associated with signal power levels, measurements for other radio-frequency signals received by device 12, etc.). If desired, the test data measurement process may be conducted using external test equipment that is coupled to device under test 12 using a wired or wireless path (e.g., using separate software running on the external test equipment and/or the test program running on device under test 12).

Figure 8:
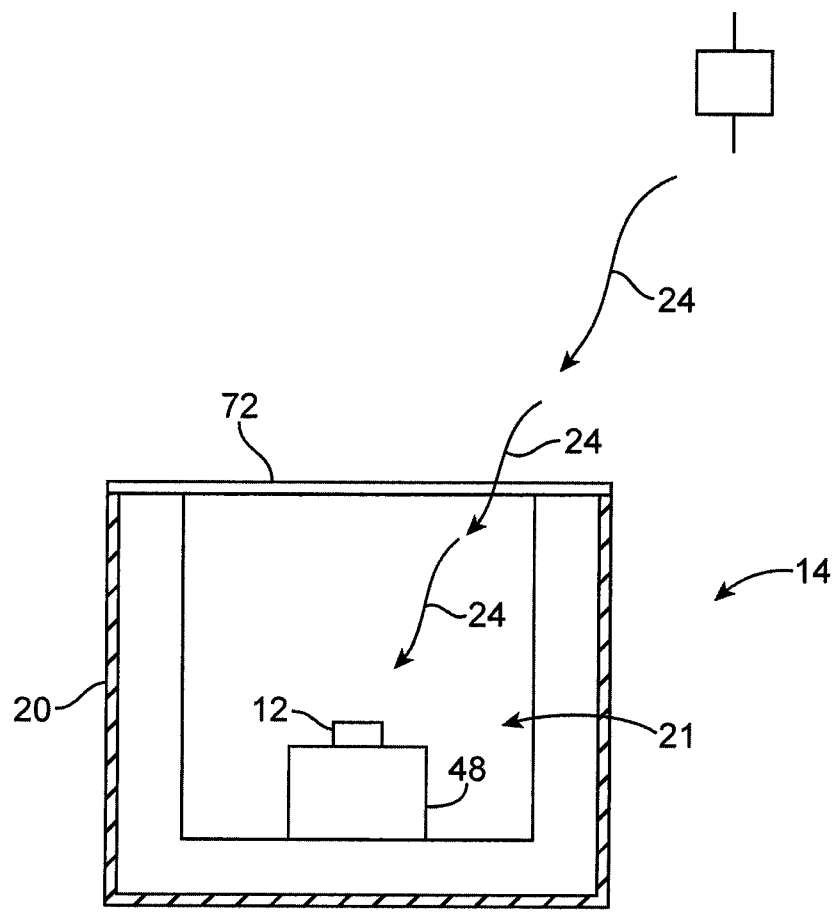
FIG. 8 is a cross-sectional side view of an illustrative field test system in which the chamber opening through which radio-frequency signals are received during testing has been provided with a radio-transparent and visibly opaque dielectric structure in accordance with an embodiment of the present invention.

At step 54, device under test 12 (or multiple devices under test) may be placed on support 48 within cavity 21 of field test system 14. Field test system 14 preferably has a lower wall and sidewalls that are covered with a layer of electromagnetic shielding material (layer 20) to reduce the effects of multipath interference during testing. The upper portion of test system 14 preferably has an opening such as opening 19 that allows external radio-frequency signals 24 such as signals from one or more GPS satellites 22, cellular telephone towers (e.g., cellular towers that communicate using protocols such as the Global System for Mobile Communications protocol, Code division multiple access protocols, Long Term Evolution Protocols, etc.), WiMax (Worldwide Interoperability for Microwave Access) sources (e.g., sources using IEEE 802.16 protocols), 60 GHz wireless communications sources, sources of wireless local area network (WLAN) signals such as IEEE 802.11 sources at 2.4 GHz or 5 GHz, sources of Bluetooth® signals at 2.4 GHz, or other external sources of radio-frequency signals to be received by receiver circuitry within device under test 12. Opening 19 may, if desired, include a low-loss dielectric other than air (e.g., a radio-frequency-transparent layer of polymer that is transparent or opaque in the visible spectrum). A cross-sectional side view of field test system 14 in a configuration in which the chamber opening through which radio-frequency signals 24 are received by device under test 12 during testing has been provided with a radio-transparent and visibly opaque planar dielectric structure 72 (e.g., to block the interior of the chamber from view and/or to prevent the intrusion of dust and moisture into cavity 21 from the environment) is shown in FIG. 8.

During the operations of step 56, device under test 12 (or each of multiple devices under test in the field test system) may use the receiver circuitry in device under test 12 to receive the incoming radio-frequency signals. During testing, control unit 66 or other suitable control circuitry may adjust the size of opening 19, the angle of acceptance 13, the position of device under test 12 within cavity 21, the position of a sleeve or other movable electromagnetic shielding structures, the position of anechoic material 20, or other attributes associated with field test system 14. Corresponding test measurements (e.g., raw and/or processed test data corresponding to the received radio-frequency signals) may be stored within storage in device under test 12 under the control of the test program that is running on the device under test and/or may be offloaded to external test equipment such as control unit 66 or other equipment over a wired or wireless path. The test measurements may include information such as signal-to-noise ratio data, signal strength data, data on performance metrics such as error rates, etc. The radio-frequency signals that are gathered by device under test 12 during testing may be gathered using one or more antennas in each device 12. Device 12 may, for example, use an antenna diversity scheme in receiving signals in which control circuitry directs transceiver circuitry within device 12 to select an optimum antenna based on which antenna is best suited to receiving (and/or transmitting) radio-frequency signals and/or may use a multiple-input-multiple-output (MIMO) scheme in which multiple parallel streams of radio-frequency data are received by respective antennas in device under test 12. In general, any suitable wireless communications scheme may be used in handling radio-frequency signals during testing (i.e., device 12 may use an antenna diversity scheme, device 12 may use a MIMO scheme, device 12 may use a fixed antenna scheme, or may use wireless communications techniques based on a combination of one or more of these schemes or other schemes). These wireless communications schemes may be used by device 12 in receiving radio-frequency signals, in transmitting radio-frequency signals, and/or in processing radio-frequency antenna signals during the operations of step 56.

After the test data has been acquired and offloaded to external test equipment (e.g., after satellite navigation system data, cellular telephone system data such as cellular telephone system data gathered by device 12 using a MIMO communications scheme and/or an antenna diversity scheme, or other test data has been acquired and provided to control circuitry 66 or other test equipment), the test data can be analyzed and appropriate actions may be taken (step 58). For example, a computer or other processing circuitry associated with test equipment 66 may be used to perform comparisons of measured data to predetermined thresholds and may apply other suitable performance criteria to the test results. As one example, time-averaged signal-to-noise ratio measurements of the type described in connection with curves B1 and B2 of FIG. 2 may be compared to threshold values to determine whether the performance of device under test 12 is satisfactory. If the test results indicate that device under test 12 has satisfied its design criteria, devices using the design of device under test 12 can be manufactured and sold to users. If the test results indicate that the design of device under test 12 has shortcomings, appropriate design revisions can be made.

Figure 9:
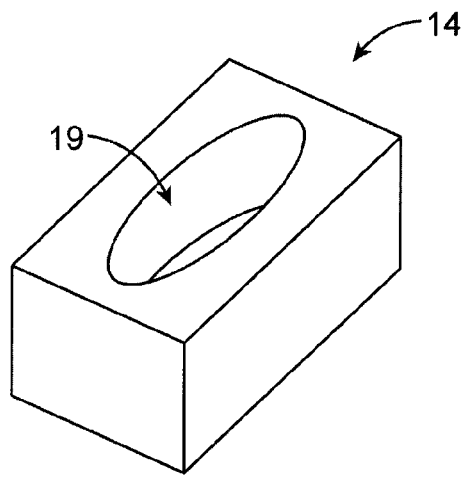
FIG. 9 is a perspective view of an illustrative field test system having a cavity with an elliptical opening, curved interior walls, and box-shaped exterior walls in accordance with an embodiment of the present invention.
Figure 10:
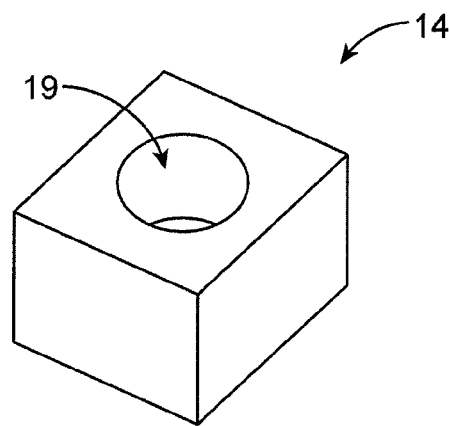
FIG. 10 is a perspective view of an illustrative field test system having a cavity with a circular opening, curved interior walls, and box-shaped exterior walls in accordance with an embodiment of the present invention.
Figure 11:
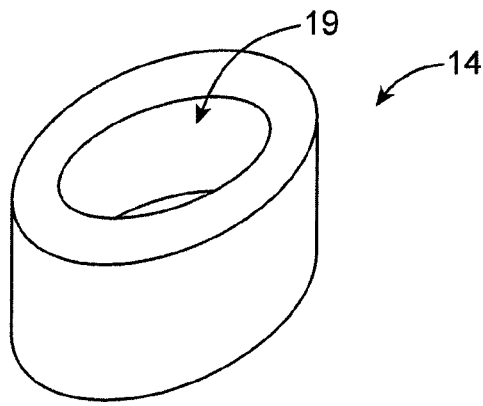
FIG. 11 is a perspective view of an illustrative field test system having a cavity with an elliptical opening, and curved interior and exterior walls in accordance with an embodiment of the present invention.

Opening 19 of field test system 14 may, in general, have any suitable shape and opening 19 may be located on any suitable side of the system (e.g., the top side, a right or left side, etc.). FIG. 9 shows how opening 19 in field test system 14 may have an elliptical shape. FIG. 10 shows how opening 19 may have a circular shape. In the FIG. 11 example, opening 19 is elliptical and the exterior walls of field test system 14 are curved. In general, opening 19 may be circular, elliptical, may have curved sides, straight sides, may be rectangular, may be square, may have a combination of curved and straight sides, or may have other suitable shapes.

Figure 12:
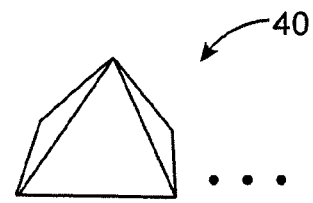
FIG. 12 is a perspective view of an illustrative pyramidal protrusion shape that may be used in anechoic lining material for a chamber in the field test system in accordance with an embodiment of the present invention.
Figure 13:
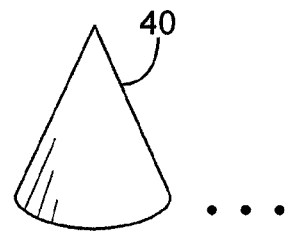
FIG. 13 is a perspective view of an illustrative conical protrusion shape that may be used in anechoic lining material for a chamber in the field test system in accordance with an embodiment of the present invention.

The interior and exterior surfaces of system 14 may be flat, may be curved, may have protrusions, or may have other suitable shapes or combinations of these shapes. FIG. 12 is a perspective view of an illustrative portion of lining 40 that has been provided with a protrusion having a pyramidal shape. FIG. 13 is a perspective view of an illustrative portion of lining 40 that has been provided with a protrusion having a conical shape. In general, dielectric lining 40 may be formed from material without protrusions (e.g., tiles having smooth flat or curved interior surfaces), material with pyramidal protrusions, conical protrusions, or protrusions of other shapes (e.g., tiles with pyramidal protrusions of the type shown in FIG. 12, tiles with conical protrusions of the type shown in FIG. 13, tiles with combinations of smooth surfaces and surfaces with protrusions, etc.). The protrusions on lining 40 are typically oriented so that they face inward (i.e., to serve as an interior surface for the cavity in field test system 14).

The foregoing is merely illustrative of the principles of this invention and various modifications can be made by those skilled in the art without departing from the scope and spirit of the invention.

What is claimed is:

1. A field test apparatus within which a wireless device under test is tested outdoors, comprising:

a dielectric layer that surrounds a cavity in which the device under test is located;

an electromagnetic shielding layer that covers the dielectric layer, wherein the electromagnetic shielding layer and the dielectric layer have an opening through radio-frequency signals pass to reach the device under test during field testing;

a control unit;

movable structures that are moved to adjust a field test apparatus parameter selected from the group consisting of: angle of acceptance for radio-frequency signals passing through the opening to the device under test, size of the opening, and position of the device under test within the cavity; and at least one actuator that moves the movable structures under control by the control unit to adjust the field test apparatus parameter.

2. The field test apparatus defined in claim 1 wherein the dielectric layer comprises anechoic material.

3. The field test apparatus defined in claim 1 wherein the dielectric material comprises a polymer with voids and wherein the dielectric layer comprises protrusions selected from the group consisting of: pyramidal protrusions and conical protrusions.

4. The field test apparatus defined in claim 1 wherein the dielectric layer has a thickness of at least two cm.

5. The field test apparatus defined in claim 1 wherein the opening comprises an opening selected from the group consisting of: a rectangular opening, a circular opening, and an elliptical opening.

6. The field test apparatus defined in claim 1 wherein the electromagnetic shielding layer comprises metal.

7. The field test apparatus defined in claim 1 wherein the electromagnetic shielding layer comprises metal foil.

8. The field test apparatus defined in claim 1 further comprising a dielectric support structure mounted within the chamber, wherein the dielectric support structure is configured to support the wireless device under test above a rear wall surface of the cavity.

9. The field test apparatus defined in claim 1 wherein the device under test comprises Global Positioning System receiver circuitry that receives Global Positioning System signals through the opening, the field test apparatus further comprising a moving vehicle that moves the electromagnetic shielding layer and the dielectric layer during testing.

10. The field test apparatus defined in claim 1 wherein the dielectric layer forms an opened-top box and wherein the electromagnetic shielding layer is located on exterior portions of the open-topped box.

11. The field test apparatus defined in claim 10 wherein the electromagnetic shielding layer comprises metal foil.

12. The field test apparatus defined in claim 1 wherein the dielectric layer forms a box shape that at least partly surrounds the cavity and wherein the device under test comprises one of a plurality of devices under test within the cavity.

13. The field test apparatus defined in claim 1 further comprising a control unit that is configured to obtain multiple-input-multiple output test data from the device under test that the device under test acquired while the device under test was within the cavity.

14. The field test apparatus defined in claim 1 wherein the opening contains a radio-transparent and visibly opaque planar dielectric structure through which the radio-frequency signals pass.

* * * * *